United States Patent [19]

Wakita

[11] Patent Number: 5,663,889
[45] Date of Patent: Sep. 2, 1997

[54] APPARATUS FOR COMPUTING DELAY TIME OF INTEGRATED CIRCUIT

[75] Inventor: Makoto Wakita, Kasugai, Japan

[73] Assignees: Fujitsu Limited, Kawasaki; Fujitsu VLSI Limited, Kasugai, both of Japan

[21] Appl. No.: 351,646

[22] Filed: Dec. 7, 1994

[30] Foreign Application Priority Data

Dec. 28, 1993 [JP] Japan ................. 5-336111

[51] Int. Cl.⁶ ......................................... G06F 17/50
[52] U.S. Cl. .................. 364/490; 364/488; 364/489
[58] Field of Search ................... 364/488, 489, 364/490, 491, 578

[56] References Cited

U.S. PATENT DOCUMENTS

| | | | |
|---|---|---|---|
| 4,827,428 | 5/1989 | Dunlop et al. | 364/491 |
| 4,924,430 | 5/1990 | Zasio et al. | 364/578 |
| 4,947,365 | 8/1990 | Masubuchi | 364/900 |
| 4,970,664 | 11/1990 | Kaiser et al. | 364/521 |
| 5,095,454 | 3/1992 | Huang | 364/578 |
| 5,168,563 | 12/1992 | Shenoy et al. | 395/500 |
| 5,173,864 | 12/1992 | Watanabe et al. | 364/491 |
| 5,210,700 | 5/1993 | Tom | 364/489 |
| 5,218,551 | 6/1993 | Agrawal et al. | 364/491 |
| 5,274,568 | 12/1993 | Blinne et al. | 364/489 |
| 5,396,435 | 3/1995 | Ginetti | 364/489 |
| 5,422,317 | 6/1995 | Hua et al. | 437/250 |
| 5,448,497 | 9/1995 | Ashar et al. | 364/489 |
| 5,459,673 | 10/1995 | Carmean et al. | 364/489 |
| 5,461,576 | 10/1995 | Tsay et al. | 364/490 |
| 5,463,563 | 10/1995 | Bair et al. | 364/490 |
| 5,471,409 | 11/1995 | Tani | 364/578 |
| 5,500,808 | 3/1996 | Wang | 364/578 |

OTHER PUBLICATIONS

Bening et al., "Developments in Logic Network Path Delay Analysis," 1982 19th Design Automation Conference, pp. 605–615.

Donath et al., "Timing Driven Placement Using complete Path Delays", 1990 27th ACM/IEEE Design Automation Conference, pp. 84–89.

Teig et al., "Timing—Driven Layout of Cell–Based ICs," VLSI Systems Design, May 1986, pp. 63–64, 68, 70–73.

Primary Examiner—Kevin J. Teska
Assistant Examiner—Leigh Marie Garbowski
Attorney, Agent, or Firm—Staas & Halsey

[57] ABSTRACT

A delay time computing apparatus includes a data base for storing data on various cells, an input device operable by a designer, and a processing unit coupled to the data base and the input device. The processing unit includes a data input interface, a path building section and a delay time computing section. The data input interface controls transfer of input data from the input device. The path building section reads detailed data on a selected cell from the data base in accordance with circuit redesign data input by a circuit designer to the data input device, and thereby constructs a signal propagation path for cells involved in circuit redesign. Every time the path building section constructs new signal propagation paths, the delay time computing section computes delay times of cells involved in circuit redesign.

8 Claims, 6 Drawing Sheets

Fig. 2 (Prior Art)
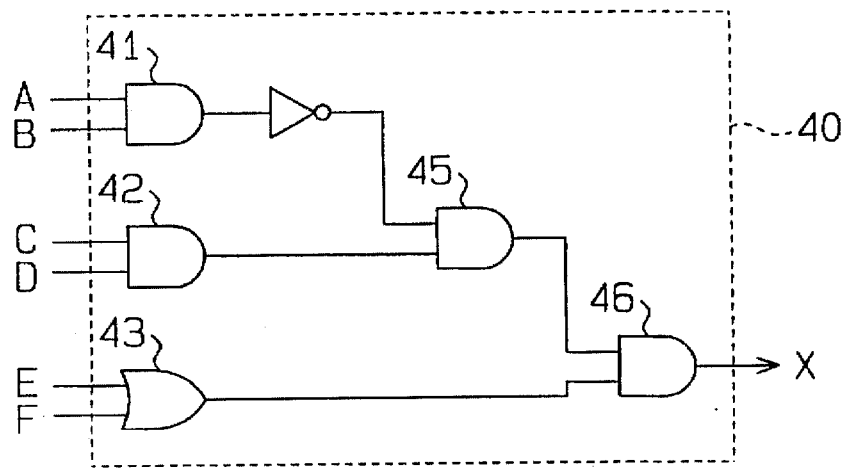
Fig. 3 A    ISG    
Fig. 3 B    OSG    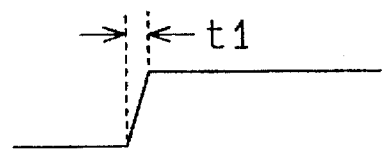
Fig. 3 C    ST     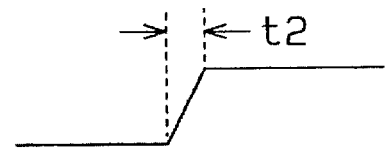
Fig. 3 D    OPS    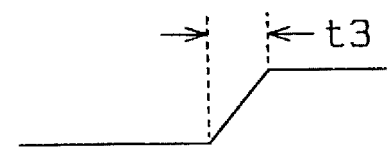

APPARATUS FOR COMPUTING DELAY TIME OF INTEGRATED CIRCUIT

BACKGROUND OF THE INVENTION

1. Field of the Invention

The present invention relates generally to an apparatus which computes the delay time of an integrated circuit. More specifically, the present invention relates to an apparatus which computes changes in signal propagation delay time caused by the load of a cell used in designing a semiconductor integrated circuit and/or caused by the load connected to that cell.

2. Description of the Related Art

Despite the trend in integrated semiconductor circuit (IC) design to design ever larger scale circuits, circuit designers have also sought to increase the speed with which these increasingly large circuits operate. In designing a semiconductor integrated circuit, the timing of the cells used in the integrated circuit is very important. As circuit operation becomes faster, the accumulative signal delay time of the individual cells is a significant factor in design layout. Generally speaking, circuit delay time is the amount of time that an output signal follows an input signal. This delay time is directly affected by signal propagation delay time, i.e., the time required for a logic signal to travel through a device or series of logical devices. One component of signal propagation delay is rise time, i.e., the time needed for the leading edge of a pulse to rise from 10% to 90% of its final value. Should the individual component or component connections be such that cause a signal to experience a longer rise or propagation delay time, the circuit's overall delay time will increase, in effect slowing down circuit operation. Increases in a signal's rise time decreases the slope of the signal's voltage potential as it changes low to high or vice versa. Careful consideration to signal propagation and delay time is therefore necessary for proper layout design. Consequently, it is important to be able to quickly compute how variations in cell layout, or more particularly, in fan-out, affects individual cell delay time. That is, it is helpful to know how various loads or how various fan-outs affect cell delay time. This is necessary in order to shorten the time for designing a semiconductor integrated circuit.

FIG. 1 shows a conventional sequence of procedures used to compute the delay time of logic circuits in a semiconductor integrated circuit. This conventional computation is adapted for the circuit whose design has been completed. First, a designer combines a plurality of selected cells and designs a logic circuit 40 as shown in, for example, FIG. 2 based on his or her own experience by using a Computer Aided Design (CAD) system at step 51. The logic circuit 40 includes four AND gates 41, 42, 45 and 46, an OR gate 43 and an inverter 44. The AND gate 41 has two input terminals A and B, and an output terminal connected to the inverter 44. The AND gate 42 has two input terminals C and D. The AND gate 45 has two input terminals respectively connected to the output terminals of the inverter 44 and the AND gate 42. The OR gate 43 has two input terminals E and F. The AND gate 46 has two input terminals respectively connected to the output terminals of the AND gate 45 and the OR gate 43, and an output terminal X.

After the design of the whole logic circuit is completed, the computer examines the design for potential signal propagation paths, i.e. individual paths extending from the associated input terminals A to F and reaching the output terminal X, at step 52. When a circuit simulation is executed, the computer computes the propagation delay times of signals for the individual paths, at step 53. The results of the computation are output on a display or a printer at step 54. The designer can know the delay times of the individual paths based on the computation results. When the computed delay time for any one of the paths does not meet design expectations or requirements, the designer alters the design of the logic circuit at step 55, and repeats the sequence of procedures of steps 52 to 54.

To realize the effect of variations in cell load or fan-out on circuit delay time requires circuit redesign, cell layout alteration, signal path reconnection and finally simulation of the new design. Using conventional techniques, this job involves a considerable amount of work and time.

As mentioned above, rise time delay occurs in signals traveling through the paths of logic circuits. FIG. 3A shows an input signal ISG exhibiting a unit step function. Signal ISG obviously contains no slope or rise time delay. FIGS. 3B, 3C and 3D, on the other hand, exhibit various rise time and turn on delays, i.e., various propagation delay characteristics. The output signal OSG shown in FIG. 3B has a specific delay time t1 caused, for example, by a logic gate cell. Additional cell interconnections may cause a turn on delay time t2 as in the signal ST shown in FIG. 3C. If signal is further propagated to one of two mutually coupled cells from the preceding cell, the output signal OPS of the succeeding cell is affected not only by a rise time delay, i.e. a decrease in the slope of the rising waveform, but also by further turn on delay. As shown in FIG. 3D, the rise time delay of signal OPS t3 is greater than either time t2 or t1, due to circuit layout redesign. The computation of the delay time involving the signal is mathematically complex, and is not usually performed manually by the designer.

SUMMARY OF THE INVENTION

Accordingly, it is a primary objective of the present invention to provide a delay time computing apparatus which computes delay times in accordance with the addition of cells, the exchanging of cells and/or load changes in a logic circuit under design or development every time such redesign occurs, thus allowing a designer to quickly and accurately know changes in delay times.

To achieve the foregoing and other objects and in accordance with the purpose of the present invention, an improved apparatus is provided, for computing delay times of integrated circuits.

The delay time computing apparatus according to the present invention comprises a data base, an input device and a processing unit. The data base stores data on various cells to be used in designing integrated includes. The input device is operable by a circuit designer to redesign a circuit, which includes at least one cell. The processing unit is coupled to the data base and the input device, and includes a data input interface, a path building section and a delay time computing section.

The data input interface is coupled to the input device, and controls transfer of input data from the input device. The path building section is coupled to the data input interface and the data base, and reads detailed data on a selected cell from the data base as well as data corresponding to redesigned circuit elements input by the designer to the data input interface. The building section constructs a signal propagation path for cells involved in circuit redesign while referring to the read data. The delay time computing section is coupled to the path building section. Every time the path building section constructs new signal propagation paths, the delay time computing section computes delay times of cells involved in the new circuit and path design.

BRIEF DESCRIPTION OF THE DRAWINGS

The features of the present invention that are believed to be novel are set forth with particularity in the appended claims. The invention, together with objects and advantages thereof, may best be understood by reference to the following description of the preferred embodiments together with the accompanying drawings in which:

FIG. 2 is a circuit diagram showing an example of a logic circuit;

FIGS. 3A, 3B, 3C and 3D are waveform charts illustrating the various signal propagation delay characteristics of input and output signals;

DETAILED DESCRIPTION OF THE PREFERRED EMBODIMENT

Figure 1:
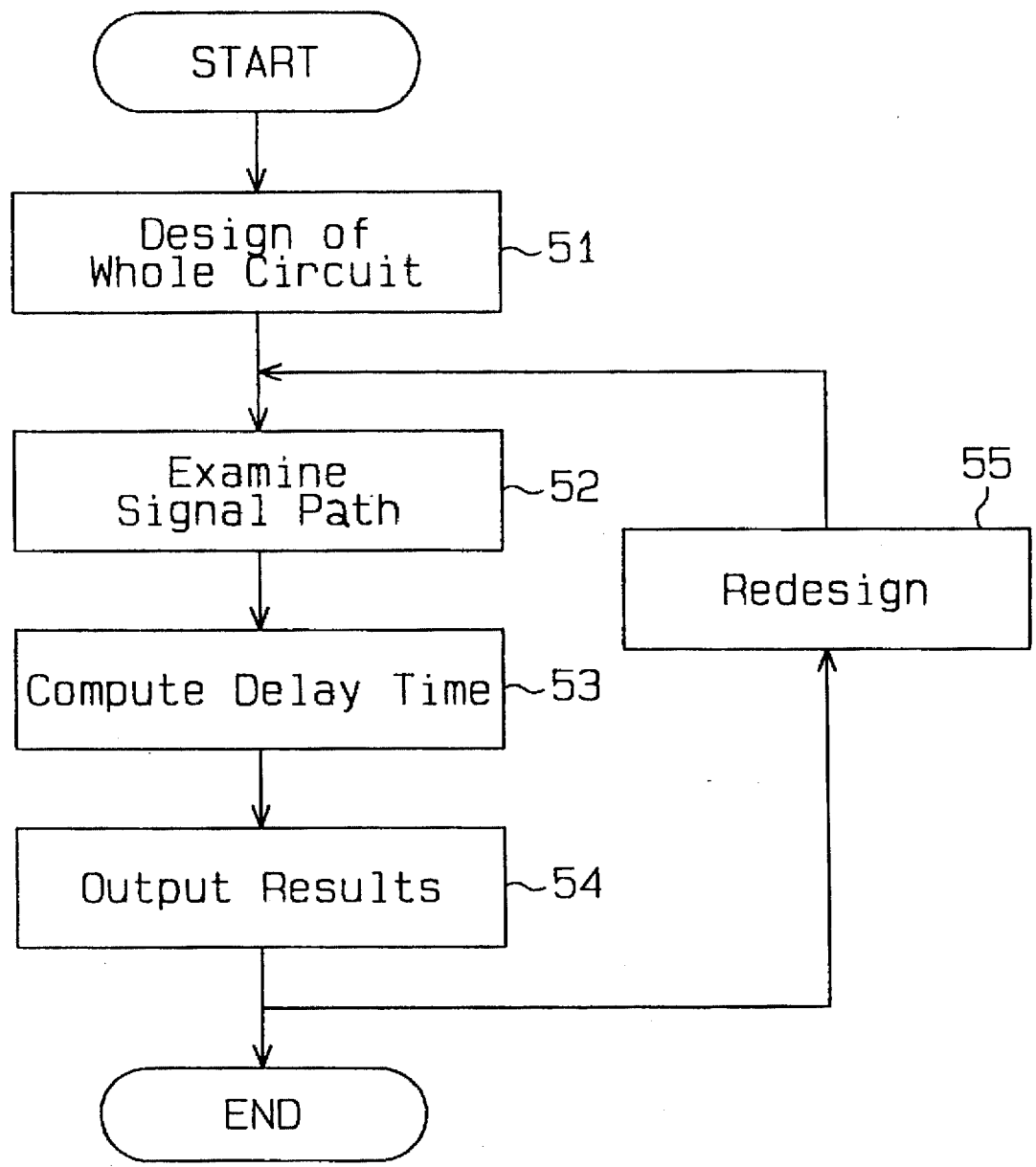
FIG. 1 is a flowchart illustrating a conventional sequence of procedures for computing delay times.
Figure 4:
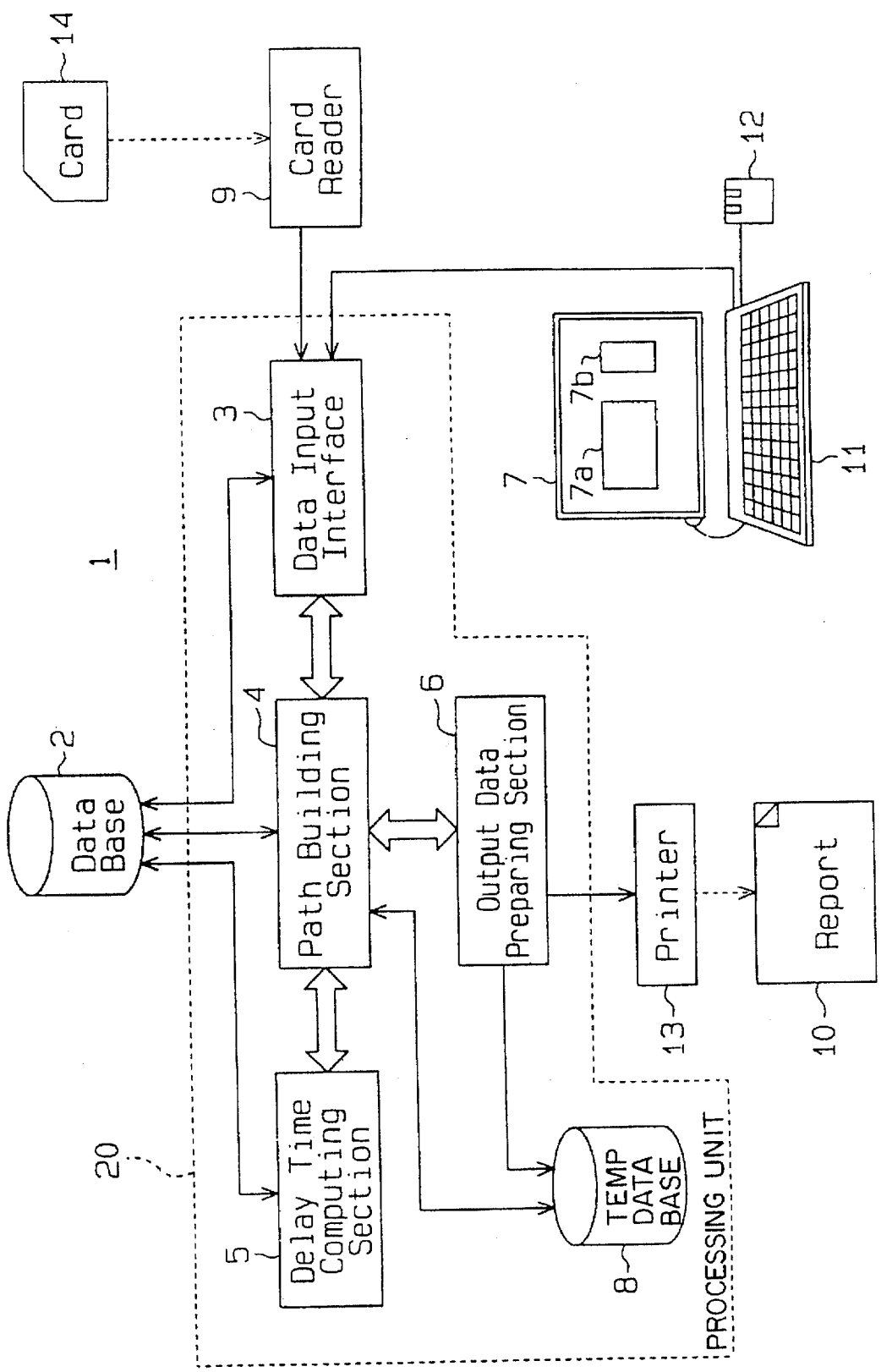
FIG. 4 is a schematic diagram showing a delay time computing apparatus according to an embodiment of the present invention.

An embodiment of the present invention will now be described referring to the accompanying drawings. FIG. 4 shows a delay time computing apparatus 1 for semiconductor integrated circuits according to this embodiment. This computing apparatus 1 is composed of a CAD system, which includes a processing unit 20, a main data base 2, a temp-data base 8, a card reader 9, a CRT 7, a keyboard 11, a mouse interface 12 and a printer 13. The processing unit 20 is the main body of a computer comprising one or more CPUs, ROMs and RAMs (not shown), and includes a data input interface 3, a path building section 4, a delay time computing section 5, and an output data preparing section 6. The processing unit 20 is connected to its peripheral devices 2, 7, 9, 11, 12 and 14 as shown in FIG. 4.

The main data base 2 stores data about various cells for use in designing a semiconductor integrated circuit. Each cell data includes at least one equation for computing the delay time of that cell and various parameters which are used in that equation. The cell's delay time is a time lag, for example, from when an L-level signal has been input to that cell until when the cell outputs an H-level signal.

The typical examples of the mentioned equations are an equation for computing a delay time originating from the propagation delay of an input signal and an equation for computing a delay time while referring to the conditions of terminals other than the selected terminal of a cell involved in a single signal propagation path. The typical parameters are a parameter $\alpha$, which reflects the propagation delay of an input signal, and a parameter $\beta$, which reflects the conditions of the terminals other than the selected terminal of a cell.

The equation for computing a total delay time T3 (seconds) originating from the input signal's propagation delay is as follows:

$$T3 = \alpha \times T1 + \beta \times CP + \gamma$$

Here, "T1" is the time (seconds) corresponding to the propagation delay of the signal supplied to a particular cell from the preceding cell, "$\alpha$" is a coefficient which is dimensionless (seconds/seconds), "CP" is the total capacitance (farads) of the interconnections associated with the subject cell, "$\beta$" is a coefficient whose unit is seconds/farads, and "$\gamma$" is the specific delay time (seconds) of the particular cell. T1 is given by the following equation:

$$T1 = a \times T2 + b$$

Here, "T2" is the time (seconds) corresponding to the propagation delay of the signal supplied to the preceding cell, "a" is a coefficient which reflects the influence of that propagation delay, and which is dimensionless (seconds/seconds), and "b" is the specific delay time (seconds) of the preceding cell.

The card reader 9 reads data needed to insert a desired cell into a circuit under design from the control card 14. This data for cell insertion includes data about the cell to be inserted, where the cell is inserted, and data about the interconnection capacitance, if necessary. The cell to be inserted refers to a cell, which is to be added into the circuit under design, or a cell, which is to replace one cell in that circuit. The data read by the card reader 9 is input to the data input interface 3. If no card reader 9 is used, the designer manipulates the keyboard 11 and/or the mouse 12 to input the data for cell insertion to the data input interface 3 of the processing unit 20.

The data input interface 3 analyzes the data entered through the card reader 9, the keyboard 11 and/or the mouse 12, and outputs the analysis result to the path building section 4.

The path building section 4 reads detailed information about the selected cell from the main data base 2, and sets the signal propagation path while referring to the cell insertion position. The path building section 4 stores data about the set path and the used cell into the temp-data base 8.

The output data preparing section 6 reads the information on the path built by the path building section 4 from the tempdata base 8, and transfers its information to the CRT 7 and/or the printer 13. The printer 13 provides a report 10 on the transferred data. The CRT 7 displays the transferred data on a first window area 7a on its screen. The screen of the CRT 7 also has a second window area 7b for displaying a list of cells which are available to be inserted in the circuit under design. The designer can select the cell to be inserted while referring to that cell list.

Figure 5:
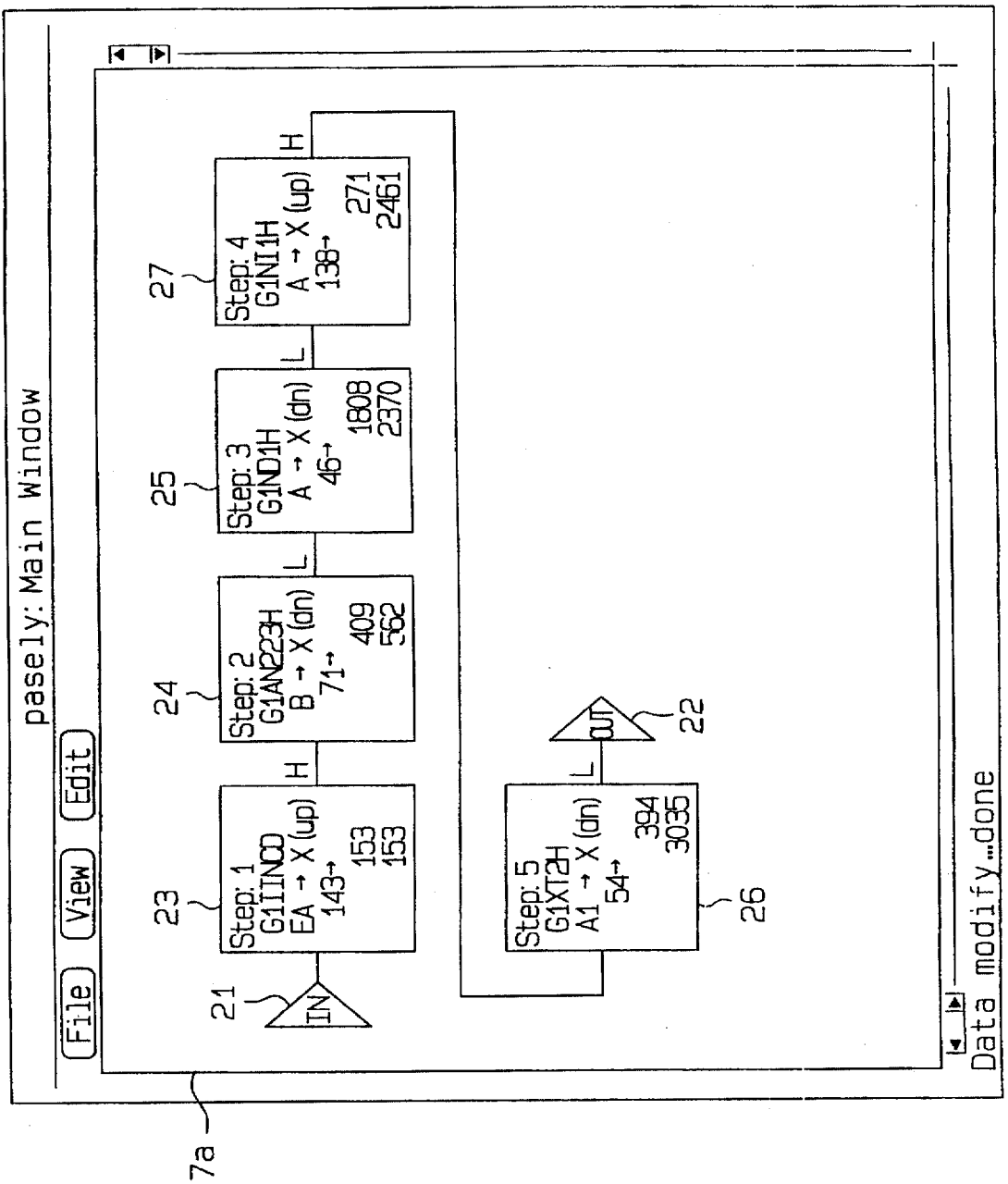
FIG. 5 is a diagram exemplifying what is displayed on a CRT.

FIG. 5 exemplifies what is displayed in the first window area 7a. The displayed example shows that a circuit under design has a path built by an input terminal 21, an output terminal 22 and a plurality of cells 23, 24, 25, 27 and 26 laid out between those terminals 21 and 22. The cell 27, between cell 25 and 26, is the latest cell inserted in the path. When the cell 27 is inserted, the path building section 4 reconstructs data on the path including the cell 27 and registers the reconstructed data in the temp-data base 8.

The delay time computing section 5 of the processing unit 20 reads the information on the cells, selected by the designer, from the main data base 2 and computes delay times for the selected cells. The computed delay times are transferred to the path building section 4 and are stored in the main data base 2 together with data describing other cells in the associated path.

Figure 6:
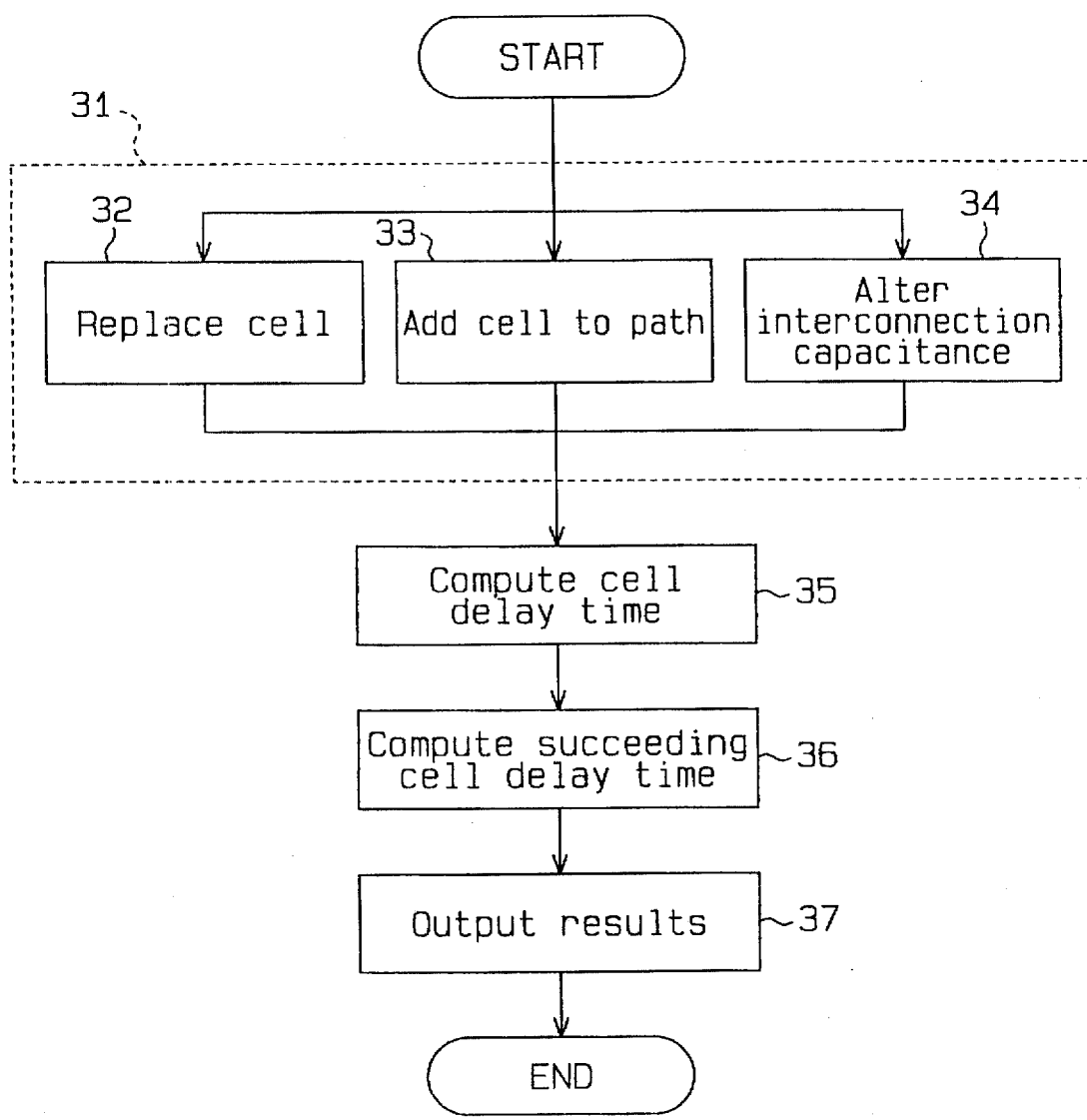
FIG. 6 is a flowchart illustrating the main routine of a delay time computation executed by the apparatus shown in FIG. 4.

The calculation of the delay time according to this embodiment is executed in accordance with the flowchart illustrated in FIG. 6. First, a path where a signal travels is redesigned step at 31. This redesigning is accomplished by replacing an existing cell in the path with another cell at step 32, adding a new cell into the path at step 33 or altering the capacitance of the interconnection between cells at step 34. As soon as any one of the processes at those steps 32, 33 and 34 is executed, the delay time of the cell involved in the redesign is computed at step 35 in accordance with the subroutine in FIG. 7. Next at step 36, the delay time of the next successive cell in the redesigned path is calculated. Following this at step 37, the delay times computed in steps 35 and 36 are then output to a CRT7 or printer 13.

Figure 7:
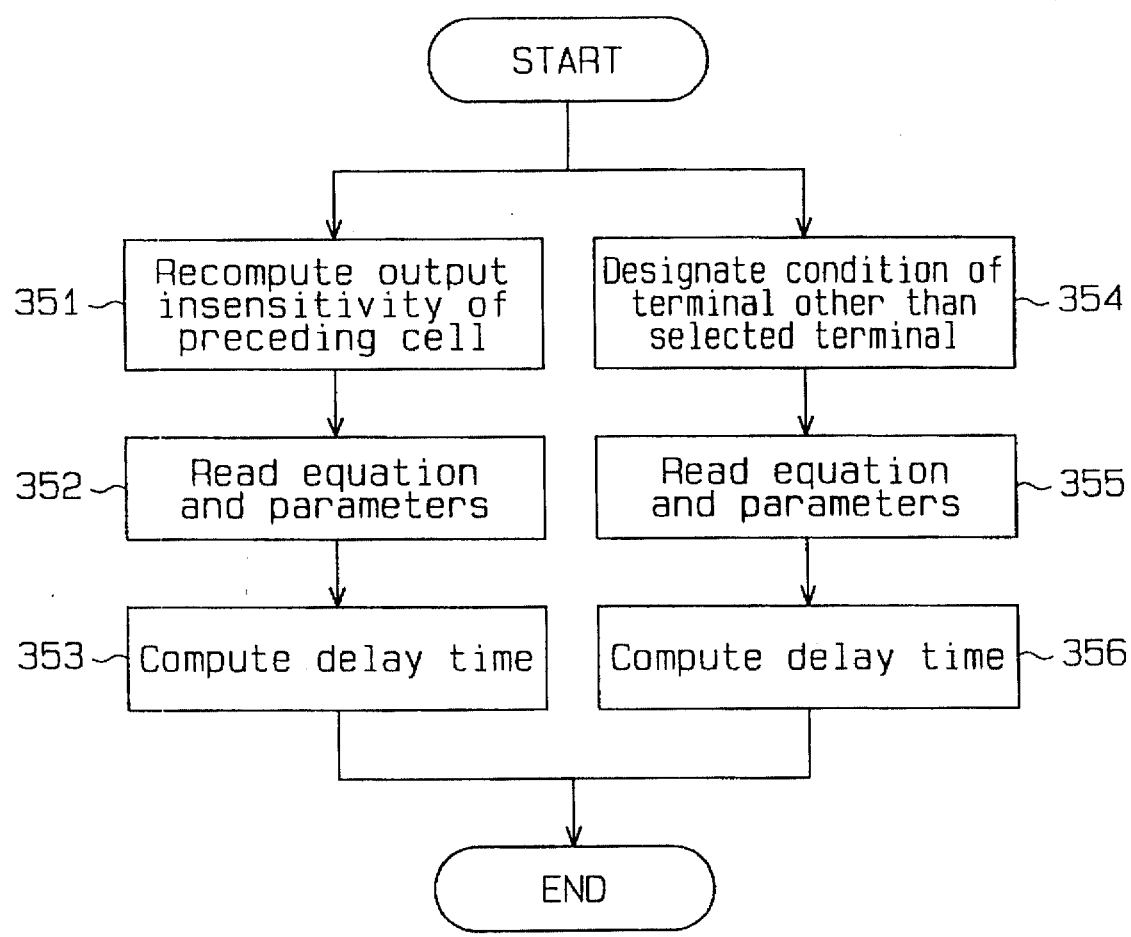
FIG. 7 is a flowchart illustrating a subroutine in the delay time computation.

The subroutine for the delay time Calculation shown in FIG. 7 includes a first sequence of calculation procedures (steps 351, 352 and 353) reflecting the propagation of an input signal, and a second sequence of calculation procedures (steps 354, 355 and 356) reflecting the conditions of the terminals other than the selected terminal of the cell involved in the path of interest. The delay time computing section 5 computes two types of delay times according to the first and second sequences of calculation procedures.

The first sequence of calculation procedures will now be explained. At step 351, the delay time computing section 5 recalculates the propagation delay of the output signal from the cell positioned just preceding the added or redesigned cell. This takes advantage of the fact that propagation delay of the newly added cell incorporates the propagation delay of the preceding cell. The propagation delay at the output of the preceding cell is considered to be the propagation delay at the input of the added cell.

At step 352, the delay time computing section 5 reads the equation representing the total delay time T3 including parameters for the added cell from the main data base 2. Based on the propagation delay obtained at step 351 and the equation and parameters read at step 352, the delay time for the added cell is computed at step 353.

When the design layout includes prepositioned cells between the added cell and the output of the circuit, the propagation delay of the prepositioned cells based on the addition of the added cell. Thus, at step 36, the sequence of the computation processes at steps 351 to 353 is repeatedly performed for any cells prepositioned between the added cell and the circuit's output.

According to the second sequence of calculation procedures (steps 354, 355 and 356), the delay time computing section 5 designates the condition of terminals other than the selected terminal of the specific cell involved in the path of interest at step 354. The condition unit, for example, the voltage level of the signal appearing at the other terminal. At step 355, the delay time computing section 5 reads a total delay time calculation equation and parameters associated with the condition of the added cell, from the main data base 2. Based on the equation and parameters, the delay time computing section 5 computes the delay time for the added cell at step 356. When prepositioned cells exist between the added cell and the circuit's output, the sequence of the computation processes at steps 354–356 is repeatedly performed for each of these cells.

According to this embodiment, a circuit designer can add and/or alter a cell in the circuit under design or alter the loads for the circuit, using the card reader 9, the keyboard 11 and/or the mouse interface 13. Every time a cell is added or altered, the path building section 4 reconstructs a signal path including the added or altered cell, and the delay time computing section 5 computes the delay times for that reconstructed path one by one. The computed delay times together with the cells which form the new path are promptly displayed in the first window area 7a on the CRT 7. During circuit designing, therefore, the designer can accurately and in real time know the influence of the addition or alteration of a cell or a change in load on the signal delay time. This shortens the circuit designing time.

According to this embodiment, the main data base 2 stores the total delay time equation and parameters which reflect the propagation delay of the input signal, for various cells used in semiconductor integrated circuits. This allows a delay time reflecting the propagation delay of the input signal to be computed based on the equation and parameters. This scheme permits the designer to more accurately know how delay times are influenced by the addition or alteration of cells or a change in load.

The main data base 2 also stores the computation equation and parameters which reflect the conditions of terminals other than the selected terminal of the cell involved in the signal path of interest, for various cells used in semiconductor integrated circuits. This allows a delay time reflecting these conditions to be computed based on the equation and parameters. This scheme permits the designer to more precisely know how delay times are influenced by the addition or alteration of a cell or a change in load.

Although only one embodiment of the present invention has been described herein, it should be apparent to those skilled in the art that the present invention may be embodied in many other specific forms without departing from the spirit or scope of the invention. Particularly, it should be understood that this invention may be embodied in the following manners.

The delay times of cells in a designated path may be computed based on all the possible conditions involved in signal propagation. In this case, it is preferable that the maximum and minimum values of the computed delay time and the premised conditions for the computation should be displayed on the CRT 7.

Approximation equations for computing the delay times for various cells may be stored in the main data base 2, and the delay times may be simply calculated from those equations.

Data about the relationship between cell types and delay times may be stored in the main data base 2, so that a delay time can be acquired by referring to that relationship.

Furthermore, a timing circuit such as a flip-flop circuit may be interactively selected on the CRT and may be incorporated in the circuit under design. In this case, the setup time and hold time of the timing circuit may be calculated from one moment to another based on clock signals given to the timing circuit, and the computation results may be displayed on the CRT.

Therefore, the present examples and embodiment are to be considered as illustrative and not restrictive and the invention is not to be limited to the details given herein, but may be modified within the scope of the appended claims.

What is claimed is:

1. An apparatus for computing delay times of integrated circuits, comprising:

a data base storing data on various cells to be used in designing integrated circuits;

input unit operable by a designer to redesign a circuit under design; and a processing unit coupled to said data base and said input means, said processing unit including:

a data input interface, coupled to said input unit, controlling the transfer of input data from said input unit, a signal path building section, coupled to said data input interface, receiving circuit design data input by the designer on a redesigned circuit, and reconstructing a new signal propagation path coupling a cell affected by the redesign of circuit by referring to the data input by the designer, and a signal delay time computing section, coupled to said signal path building section, computing a signal delay time for the cells coupled along the new signal propagation path while reconstructing the new signal propagation path.

2. The apparatus according to claim 1 further comprising an output unit showing delay times computed by said processing unit, and wherein said processing unit further includes an output data preparing section, coupled to said output unit, displaying both the path constructed by said signal path building section and a delay time computed by said signal delay time computing section on said output unit.

3. The apparatus according to claim 2, wherein said output unit includes at least one of a CRT and a printer.

4. The apparatus according to claim 1, wherein said input unit includes at least one selected from the group consisting of a card reader, a keyboard and a mouse interface.

5. The apparatus according to claim 1, wherein the cell data, stored in said data base, includes a total delay time computation equation and parameters corresponding to the propagation delay of an input signal to a cell; and wherein at the time of computing the delay time of a cell involved in circuit redesign, said delay time computing section uses the propagation delay value determined at the output of a cell preceding the redesigned cell as the propagation delay value at the input of the redesigned cell, and computes the delay time of the redesigned cell based on said total delay time computation equation and parameters.

6. The apparatus according to claim 1, wherein the cell data, stored in said data base, includes a total delay time computation equation and parameters reflective of circuit parameters at terminals other than at the terminal of a redesigned cell coupled to said reconstructed path; and wherein at the time of computing the delay time of a cell involved in circuit redesign, said delay time computing section computes the delay time of the redesigned cell based on said total delay time computation equation and parameters.

7. A method of computing delay times of signals used in integrated circuits using a computer aided design system including a data base, input unit and processing unit, said method comprising the steps of:

inputting data about the redesign of a circuit cell as an element of a circuit;

constructing a, new signal propagation path for the redesigned circuit cell by referring to the data input to said input unit by a circuit designer;

computing a delay time of the cell affected by the circuit redesign and included in the new signal propagation paths, every time the new path is constructed.

8. A method of computing delay times of signals used in integrated circuits using a computer aided design system including a data base, input unit and processing unit having a delay time computing section, said method comprising the steps of:

inputting data about the redesign of a circuit cell as an element of a circuit;

constructing a new signal propagation path for the redesigned circuit cell by referring to the data input to said input unit by a circuit designer; and computing a delay time of the cell affected by the circuit redesign and included in the new signal propagation path, every time the new path is constructed, wherein the cell data, stored in said data base, includes a total delay time computation equation and parameters corresponding to the propagation delay of an input signal to a cell, and wherein at the time of computing the delay time of the cell involved in circuit redesign, said delay time computing section uses the propagation delay value determined at the output of a cell preceding the redesigned cell as the propagation delay value at the input of the redesigned cell, and computes the delay time of the redesigned cell based on said total delay time computation equation and parameters.

* * * * *